(12) United States Patent
Montoya et al.

(10) Patent No.: US 12,635,423 B2
(45) Date of Patent: May 19, 2026

(54) HEAT DISSIPATION METHOD USING FREQUENCY-SELECTIVE THIN-FILM COATINGS FOR CRYOGENIC ELECTRONIC CIRCUITS

(71) Applicant: United States of America as represented by the Secretary of the Navy, San Diego, CA (US)

(72) Inventors: Sergio A. Montoya, Chula Vista, CA (US); Marcio C. de Andrade, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 461 days.

(21) Appl. No.: 18/225,539

(22) Filed: Jul. 24, 2023

(65) Prior Publication Data

US 2025/0040450 A1     Jan. 30, 2025

(51) Int. Cl.
*H10N 60/81* (2023.01)
*H10N 60/01* (2023.01)

(52) U.S. Cl.
CPC ............. *H10N 60/81* (2023.02); *H10N 60/01* (2023.02)

(58) Field of Classification Search
CPC ......... H10N 60/81; H10N 60/01; H10N 69/00
See application file for complete search history.

(56) References Cited

U.S. PATENT DOCUMENTS

2019/0086164 A1*   3/2019   Yang .................. B29C 48/9135

FOREIGN PATENT DOCUMENTS

WO       WO2022178208       *   8/2022

OTHER PUBLICATIONS

Granqvist ("Radiative heating and cooling with spectrally selective Surfaces," Applied Optics, vol. 20, No. 15, pp. 2606-2615. 1981) (Year: 1981).*
Hossain et al. ("Radiative Cooling: Principles, Progress, and Potentials," Adv. Sci. 2016, 3, 2016) (Year: 2016).*
Raman et al. ("Passive radiative cooling below ambient air temperature under direct sunlight," Nature, vol. 15, pp. 540-548, 2014) (Year: 2014).*
Rephaeli et al. ("Ultrabroadband Photonic Structures To Achieve High-Performance Daytime Radiative Cooling," Nano Letters 13, pp. 1457-1461, 2013) (Year: 2013).*
(Continued)

*Primary Examiner* — Yasser A Abdelaziez
(74) *Attorney, Agent, or Firm* — Naval Information Warfare Center Pacific; Kyle Eppele; J. Eric Anderson

(57)           ABSTRACT

A heat dissipation method comprising: providing a superconducting electronic circuit; applying a thin-film coating over a surface of the circuit, wherein the thin-film coating is mostly transparent to broadband electromagnetic radiation, has a thickness of less than 100 nanometers, and is designed to dissipate visible-spectrum radiation so as to reduce radiative heat absorption by the circuit; and enclosing the thin-film-coated circuit within a broadband-frequency-transparent enclosure that is capable of maintaining superconducting conditions within the enclosure such that the circuit is exposed to broadband-frequency radiation emanating from a location outside of the enclosure.

20 Claims, 4 Drawing Sheets

(56) References Cited

OTHER PUBLICATIONS

Rephaeli et al. (Ultrabroadband Photonic Structures to Achieve High-Performance Daytime Radiative Cooling, American Chemical Society, Nano Letters, 13, pp. 1457-1461, 2013) (Year: 2013).*

Raman et al. (Passive radiative cooling below ambient air temperature under direct sunlight, Nature, 515, pp. 540-544, 2014) (Year: 2014).*

Naghshine et al. (Optimized thin film coatings for passive radiative cooling applications, Optics Communications, 410, pp. 416-423, 2018) (Year: 2018).*

Zude Lin et al.; "NTC thin film temperature sensors for cryogenics region with sensitivity and thermal stability"; Applied Physics Letters 113; (2018).

Bin Li et al.; "Infrared High-Index Coating Materials, PbTe and Pb1-xGexTe: Properties and Applications"; Chapter 2 of Coatings and Thin-Film Technologies http://dx.doi.org/10.5772/intechopen. 74351 (2019).

Mark A. Richards; "An Experimental Investigation of High Temperature Superconducting Microstrip Antennas at K- and Ka-Band Frequencies"; Ph.D. Thesis Final Report (Case Western Reserve Univ.) (Mar. 1993).

Wanda C. Peters et al.; "Tailoring Thin Film-Lacquer Coatings for Space Applications"; US Government Work under NASA Contract NAS5-32650; (1998).

Tracy L. Gibson; "Cryogenic Thermal Coatings Final Report"; Cryo-Fluid Management Project, CFT-RPT-0015 (Oct. 2022).

Robert C. Youngquist and Mark A. Nurge; "Cryogenic Selective Surfaces", Final Report on a Phase I NIAC Study (Feb. 2016).

* cited by examiner

HEAT DISSIPATION METHOD USING FREQUENCY-SELECTIVE THIN-FILM COATINGS FOR CRYOGENIC ELECTRONIC CIRCUITS

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, CA, 92152; voice (619) 553-5118; NIWC_Pacific_T2@us.navy.mil. Reference Navy Case Number 112704.

BACKGROUND OF THE INVENTION

Superconductor-based quantum sensor technologies present a pathway to develop a new generation of devices with low size/weight/power and high sensitivity that are capable of detecting electromagnetic signals across the electromagnetic spectrum. These devices exploit quantum phenomena that arise in superconductor materials when cooled below their critical temperature (i.e., temperature below which these materials exhibit a superconducting state). To preserve the superconducting state while illuminating the devices to broadband external electromagnetic radiation, one must avoid the warming of the device. There is a need to minimize the thermal load on the device that arises from external heat sources.

SUMMARY

Described herein is a heat dissipation method to reduce incoming radiative heat, an embodiment of which comprises the following steps. The first step involves providing a superconducting electronic circuit. Another step provides for applying a thin-film coating over a surface of the circuit. The thin-film coating is mostly transparent to broadband electromagnetic radiation, has a thickness of less than 100 nanometers, and is designed to dissipate radiative heat so as to reduce radiative heat absorption by the circuit. Another step provides for enclosing the thin-film-coated circuit within a mostly broadband-frequency-transparent enclosure that is capable of maintaining superconducting conditions within the enclosure. Another step provides for exposing the circuit to broadband electromagnetic radiation emanating from a location outside of the enclosure.

An embodiment of the heat dissipation method is also disclosed herein as comprising the following steps. A first step involves providing a cryogenic electronic circuit. Another step provides for applying a multi-layer thin-film coating directly on a surface of the circuit. The thin-film coating is mostly transparent to broadband-electromagnetic radiation, has a thickness of less than 100 nanometers, and is designed to dissipate visible- and ultraviolet-spectrum radiation so as to reduce radiative heat absorption by the circuit. Each layer of the thin-film coating possesses different frequency-dependent permittivity and permeability characteristics. Another step provides for enclosing the thin-film-coated circuit within a broadband-frequency-transparent enclosure that is capable of maintaining cryogenic conditions within the enclosure. Another step provides for exposing the circuit to broadband electromagnetic radiation emanating from a location outside of the enclosure.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed method below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
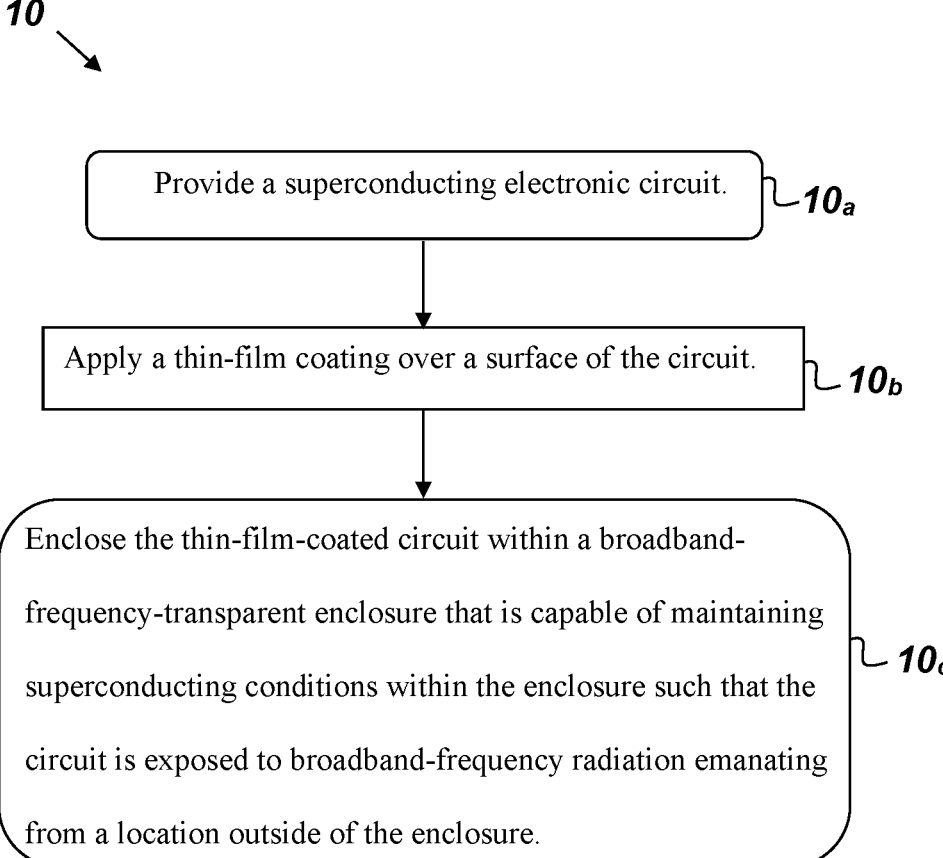
FIG. 1 is a flowchart of a heat dissipation method.

FIG. 1 is a flowchart of a heat dissipation method 10 that comprises, consists of, or consists essentially of the following steps. The first step 10a involves providing a superconducting electronic circuit. Another step 10b provides for applying a thin-film coating over a surface of the circuit. The thin-film coating is mostly transparent to broadband-electromagnetic radiation, has a thickness of less than 100 nanometers, and is designed to dissipate visible- and ultraviolet-spectrum electromagnetic radiation so as to reduce radiative heat absorption by the circuit. Another step 10c provides for enclosing the thin-film-coated circuit within a broadband-frequency-transparent enclosure that is capable of maintaining cryogenic conditions within the enclosure such that the circuit is exposed to broadband electromagnetic radiation emanating from a location outside of the enclosure. The enclosure may be made of any desired material (preferably not glass) that is broadband-frequency-transparent and capable of maintaining an internal environment where superconducting electronic circuits can operate. For example, the enclosure must be able to maintain a suitable temperature and pressure for at least nitrogen to exist in liquid form.

Method 10 may be used to improve the performance of cryogenic electronic circuits that are directly or indirectly exposed to broadband electromagnetic radiation. Method 10 may be used to reduce: (i) radiative heat absorption by the circuit that conventionally results from impinging thermal radiation as well as (ii) unwanted electromagnetic effects that can produce electronic noise or can destroy the superconducting state. Regardless of whether or not the superconducting circuit exploits quantum or non-quantum phenomena, method 10 allows for superconducting circuits to be fully or partially exposed to signals across the electromagnetic spectrum such as radio frequency (RF) and/or optical signals.

Figure 2:
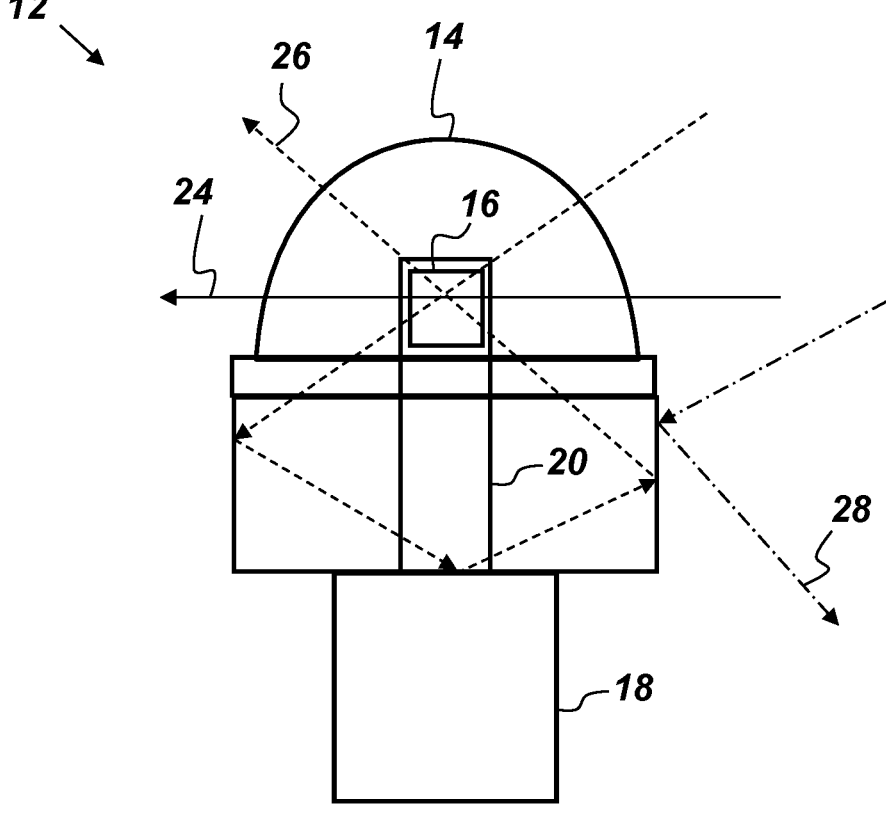
FIG. 2 is a transparent view of an example of a cryogenic enclosure.

FIG. 2 is a transparent view of an example of a cryogenic enclosure 12 that may be used in conjunction with method 10. The example cryogenic enclosure 12 comprises a radome 14, a superconducting electronic circuit 16, a cryocooler 18, and a cold-finger 20. The radome 14 facilitates maintaining the required high or ultra-high vacuum environment within the cryogenic enclosure (i.e., within the radome 14) which is required to cool-down the superconducting electronic circuit 16, which may be a quantum sensor for example. The radome 14 may also be designed to allow the penetration of broadband-electromagnetic signals with minimal attenuation. In this example cryogenic enclosure 12, the superconducting circuit 16 is kept in contact with the cryocooler cold-finger 18, which may be, for example, a physical probe that generates a localized cold surface. The cryocooler 18 faciliates cooling the superconducting electronic circuit 16 to its operation temperature which is below the critical temperature of the superconductor material used to fabricate the superconducting electronic circuit. Some examples of superconductor materials include Nb, Al, YBCO, NbTi, NbN, NbGe, NbAl, NbCN, NbSn, and combinations thereof. FIG. 2 also shows a first example incident RF signal 24 that travels across/through the radome 14 (potentially interacting with the superconducting circuit 16) without scattering or dissipation within the cryogenic enclosure 12. Another example, the RF signal 26 is also shown as traveling across/through the radome 14 (potentially interacting with the superconducting circuit 16) and then scattering at least once within the cryogenic enclosure 12. Afterwards, the scattering RF signal 26 can couple with the superconducting electronic circuit 16, which results in undesirable electromagnetic noise. Finally, a third example signal 28 is shown as being reflected off the cryogenic enclosure 12.

Figure 3A:
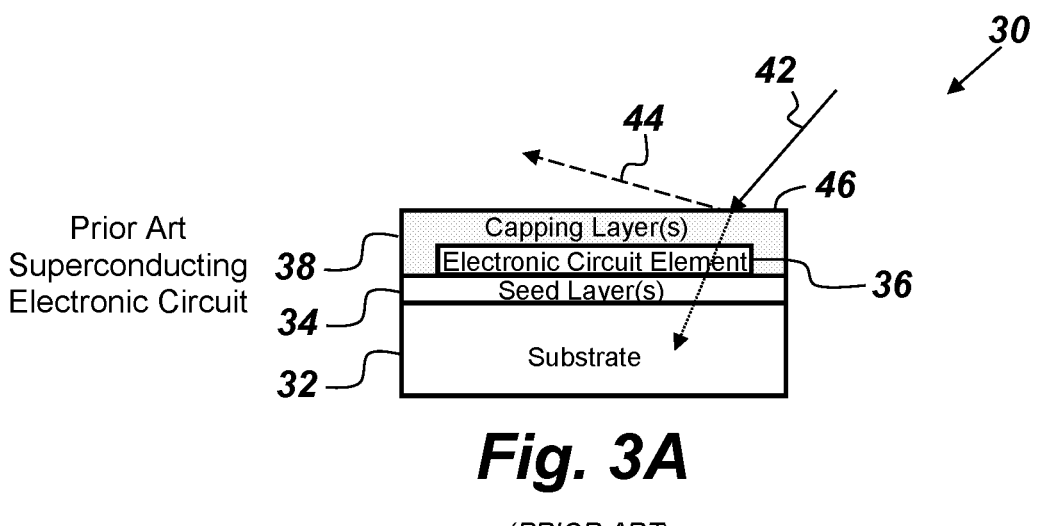
FIG. 3A is a cross-sectional view of a simple prior art superconducting electronic circuit.
Figure 3B:
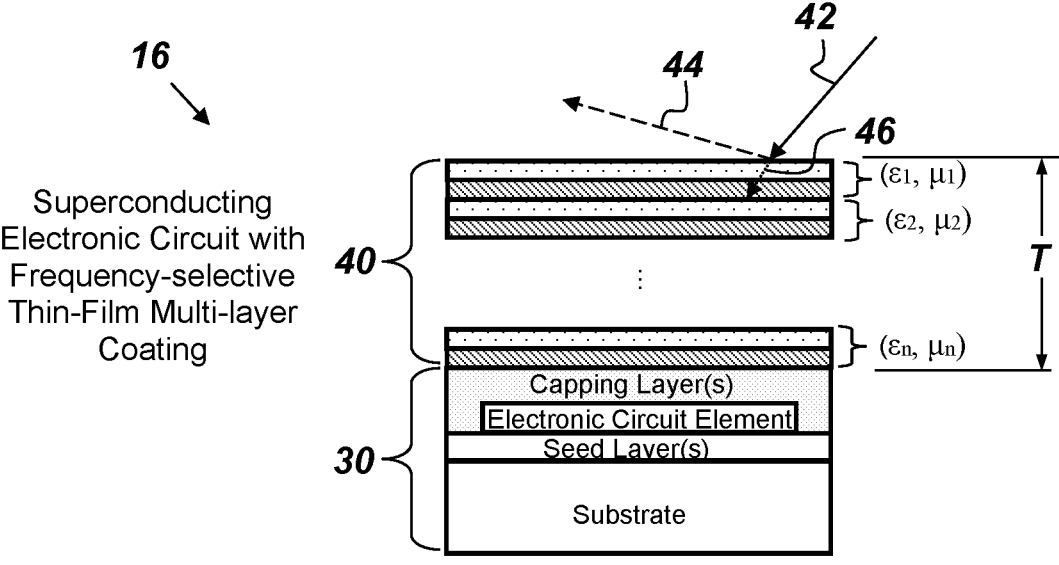
FIG. 3B is a cross-sectional view of an embodiment of a superconducting electronic circuit.

FIG. 3A is a cross-sectional view of a simple prior art superconducting electronic circuit 30 that consists of a substrate 32, a seed layer 34, a superconducting electronic circuit element 36, and a capping layer 38. FIG. 3B is a cross-sectional view of an embodiment of the superconducting electronic circuit 16, which in this case is a radiative heat dissipating superconducting electronic circuit fabricated according to one embodiment of method 10. The embodiment of the superconducting electronic circuit 16 shown in FIG. 3B comprises a multi-layer thin-film coating 40 applied directly to the superconducting electronic circuit 30 to dissipate any heat due to incoming electromagnetic radiation. The complexity of each building block (e.g., substrate, seed layer(s), etc.) can differ between different superconducting devices/circuits due to fabrication processes and the material(s) utilized in each of the building blocks. The multi-layer thin-film coating 40 may be designed to reflect visible- and ultraviolet-spectrum radiation as well as unwanted RF signals that are not of interest to the superconducting electronic circuit 30. For example, the thin-film coating 40 in FIG. 3B is a frequency selective thin-film bilayer heterostructure with N-repetitions where each thin-film coating possesses different frequency-dependent permittivity and permeability. It is preferable that the thin-film coating 40 be made of materials that do not outgas. For example, it is desirable that the thin-film coating 40 not be a lacquer coating that can outgas within the radome 14.

Referring to FIGS. 3A and 3B, example representations of incident radiation 42, reflected radiation 44, and absorbed radiation 46 are illustrated as respectively interacting with the prior art superconducting electronic circuit 30 and the superconducting electronic circuit 16 that includes the frequency-selective thin-film coating 40. By including frequency selective thin-film coatings, one can ensure most of the energy from incident thermal radiation is reflected thus minimizing the radiative heat that is absorbed by the superconducting electronic circuit 16. An additional set, or layer, of thin-film coatings can be tailored to specifically address a selection of RF signals that can electromagnetically couple and/or saturate the protected superconducting electronic circuit 16. The chemical composition and layer thickness of each thin-film coating can be engineered to exhibit a unique combination of permittivity and permeability properties, which directly facilitates developing a tailored frequency-selective surface that can facilitate thermally protecting the superconducting electronic circuit 16. Method 10 can be utilized to reflect and/or attenuate (e.g., laterally transfer a heat load away) specific radiation which introduces undesirable heat that can potentially impact the operation of the superconducting electronic circuit 16 or the heat load capacity of the cryocooler 18. The frequency selective thin-film coatings 40 can be placed directly over a surface of the superconducting electronic circuit 30. Thus, the fabrication process utilized to create the superconducting electronic circuit 30 is unaltered. The different multi-layer thin-film coatings 40 with varied chemical composition may be chosen to serve as environmental protection barriers that preserve the quality of the underlying superconducting electronic circuit 30. In one embodiment, the thin-film coating 40 is designed to be mostly transparent to RF radiation and has a thickness T of less than 100 nanometers.

The thin-film coating 40 may be synthesized directly on the superconducting electronic circuit 30. The thin-film coating 40 may be in the form of continuous films, such as shown in FIG. 3B that extended over the entire superconducting electronic circuit 30, including simple or complex geometrically-defined patterns that extend across the superconducting electronic circuit 30. Also, the order between the protective capping layer and the frequency selective thin-film coatings 40 (shown schematically in FIG. 3B) may be reversed such that the thin-film coating 40 is disposed beneath the capping layer 38 of the circuit 30. Although the circuit 30 is shown in FIGS. 3A and 3B as having a seed layer, it is to be understood that method 10 is not limited to use with superconducting or cryogenic electronic circuits having seed layers; similarly, it is to be understood that method 10 is not limited to the use of superconducting or cryogenic electronic circuits having capping layer(s).

Figure 4A:
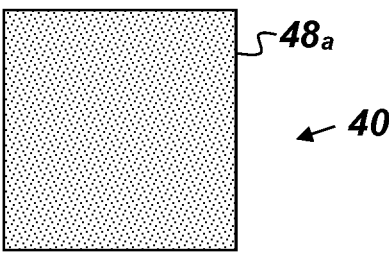
FIGS. 4A and 4B are respectively top and side views of an embodiment of a thin-film coating.
Figure 4B:
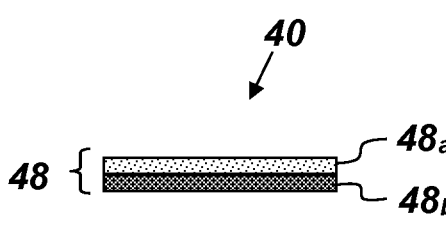
Figure 4C:
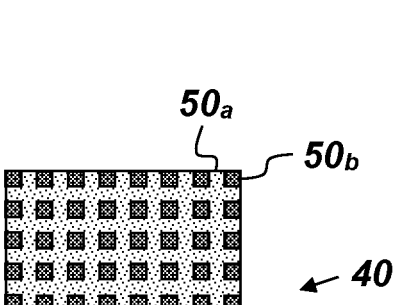
FIGS. 4C and 4D are respectively top and side views of an embodiment of a thin-film coating.
Figure 4D:
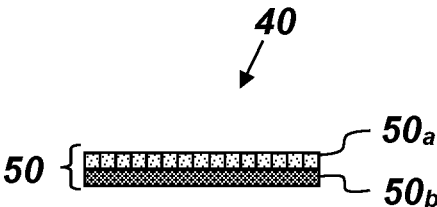
Figure 4E:
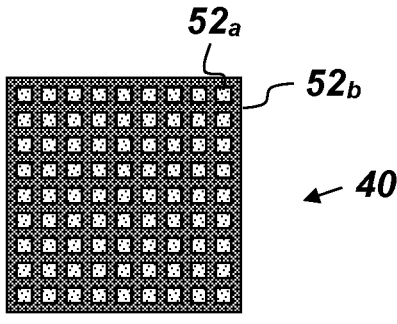
FIGS. 4E and 4F are respectively top and side views of an embodiment of a thin-film coating.
Figure 4F:
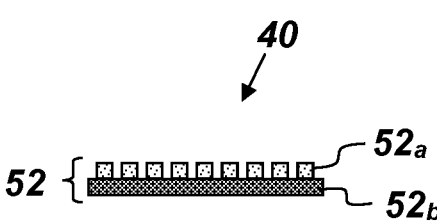

FIGS. 4A-4F are illustrations of different example embodiments of the multi-layer thin-film coating 40 that may be used in conjunction with method 10. FIGS. 4A and 4B are respectively top and side views of an embodiment of the multi-layer thin-film coating 40 comprising a continuous, uniform bilayer thin-film heterostructure 48 having a first layer 48a and a second layer 48b. FIGS. 4C and 4D are respectively top and side views of an embodiment of the multi-layer thin-film coating 40 comprising a negative etch bilayer thin-film heterostructure 50 having a first layer 50a and a second layer 50b. The first layer 50a, which is disposed on top of the second layer 50b, is negatively etched with square-grid features. FIGS. 4E and 4F are respectively top and side views of an embodiment of the multi-layer thin-film coating 40 comprising a positive etch top-layer thin-film heterostructure 52 having a first layer 52a and a second layer 52b. The first layer 52a, which is disposed on top of the second layer 52b, is positively etched to with square-grid features as shown. It is to be understood that the multi-layer thin-film coatings 40 shown in FIGS. 4A-4F are examples only and method 10 is not limited to those particular designs for the multi-layer thin-film coating 40.

Alternative geometric structures may be utilized for the thin-film coating 40 to locally disperse/dissipate electromagnetic radiation. Further, method 10 is not limited to bilayer thin-film coatings, but one may utilize any desired number of thin-film layers, where each layer has a single or multi-element composition. The thin-film coating 40 may be applied to a local area of the cryogenic electronic circuit 30 or the whole integrated circuit 30.

Method 10 enables the cryogenic enclosure 12 to be placed in an uncontrolled temperature environment (e.g., field location) outside a laboratory, or even moved periodically from place to place where the different locations have differing environments. The cryogenic electronic circuit that method 10 protects may be any superconducting circuit or complementary metal-oxide semiconductor (CMOS) circuit or both.

From the above description of method 10, it is manifest that various techniques may be used for implementing the concepts of method 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that method 10 is not limited to the particular embodiments described herein, but is capable of many embodiments without departing from the scope of the claims.

We claim:

1. A heat dissipation method comprising:
   providing a superconducting electronic circuit;
   applying a thin-film coating over a surface of the superconducting electronic circuit to create a thin-film-coated circuit, wherein the thin-film coating has a thickness of less than 100 nanometers and is designed to dissipate visible- and ultraviolet-spectrum electromagnetic radiation so as to dissipate radiative heat so as to reduce radiative heat absorption by the thin-film-coated circuit; and
   enclosing the thin-film-coated circuit within a radome that is capable of maintaining superconducting conditions within the radome; and
   exposing the thin-film-coated circuit to electromagnetic radiation emanating from a location outside of the radome.

2. The heat dissipation method of claim 1, wherein the thin-film coating is designed to reflect radiation from one or more of a visible spectrum and an ultraviolet spectrum away from the thin-film-coated circuit.

3. The heat dissipation method of claim 1, wherein the thin-film coating is designed to laterally transfer radiative heat load away from the thin-film-coated circuit.

4. The heat dissipation method of claim 1, wherein the thin-film coating is designed to reflect RF signals that can electromagnetically couple to, or saturate, the thin-film-coated circuit.

5. The heat dissipation method of claim 1, wherein the thin-film coating is disposed beneath a capping layer of the superconducting electronic circuit.

6. The heat dissipation method of claim 1, wherein the surface is an upper surface of a capping layer, and wherein the applying step is performed such that the thin-film coating covers the entire upper surface of the capping layer of the superconducting electronic circuit.

7. The heat dissipation method of claim 1, wherein the thin-film coating comprises multiple layers of thin-film sub-coatings over a surface of the superconducting electronic circuit, wherein each thin-film sub-coating possesses different frequency-dependent permittivity and permeability characteristics.

8. The heat dissipation method of claim 7, wherein the thin-film coating is a continuous bilayer comprising thin-film heterostructures.

9. The heat dissipation method of claim 7, wherein the thin-film coating is a negative-etch bilayer thin-film heterostructure with square-grid features.

10. The heat dissipation method of claim 7, wherein the thin-film coating is a positive-etch top-layer thin-film heterostructure with square-grid features.

11. The heat dissipation method of claim 7, wherein the thin-film coating has a frequency-selective thin-film bilayer heterostructure with N-repetitions wherein each repetition of the thin-film coating possesses different frequency-dependent permittivity and permeability characteristics.

12. The heat dissipation method of claim 1, wherein the superconducting electronic circuit consists of a high-density superconducting multi-layer integrated circuit.

13. A heat dissipation method comprising:
   providing a cryogenic electronic circuit;
   applying a multi-layer thin-film coating directly on a surface of the cryogenic electronic circuit to create a thin-film-coated circuit, wherein the multi-layer thin-film coating has a thickness of less than 100 nanometers and is designed to dissipate one or more of visible-spectrum radiation and ultraviolet-spectrum radiation so as to reduce radiative heat absorption by the thin-film-coated circuit, wherein each layer of the multi-layer thin-film coating possesses different frequency-dependent permittivity and permeability characteristics;
   enclosing the thin-film-coated circuit within a radome that is capable of maintaining cryogenic conditions within the radome; and
   exposing the thin-film-coated circuit to electromagnetic radiation emanating from a location outside of the radome.

14. The heat dissipation method of claim 13, further comprising positioning the radome in an uncontrolled temperature environment.

15. The heat dissipation method of claim 14, further comprising periodically moving the radome to different uncontrolled temperature environments.

16. The heat dissipation method of claim 14, wherein the multi-layer thin-film coating is not made of lacquer so as to prevent outgassing from the multi-layer thin-film coating within the radome.

17. The heat dissipation method of claim 16, wherein the cryogenic electronic circuit is selected from the group consisting of superconducting circuits and complementary metal-oxide semiconductor circuits.

18. The heat dissipation method of claim 13, further comprising:
   embedding the thin-film-coated circuit in a hybrid architecture computing and sensing system comprising non-superconducting electronics and superconducting electronics; and
   interfacing with the thin-film-coated circuit via the non-superconducting electronics such that input and output signals from the thin-film-coated circuit are sent through the non-superconducting electronics.

19. The heat dissipation method of claim 18, wherein the non-superconducting electronics are CMOS electronics.

20. A heat dissipation method comprising:

disposing a first thin film layer directly on a top surface of a capping layer of a superconducting circuit made of superconducting material;

disposing a second thin-film on top of the first thin-film layer, wherein the second thin-film layer has different frequency-dependent permittivity and permeability characteristics than the first thin-film layer, and wherein the first thin-film layer and the second thin-film layer create a multi-layer thin-film coating;

negatively etching the second thin-film layer to leave a grid of square features of the second thin-film layer disposed on the first thin-film layer, wherein the multi-layer thin-film coating has a thickness of less than 100 nanometers and is designed to dissipate visible-spectrum radiation and ultraviolet-spectrum radiation so as to reduce radiative heat absorption by the superconducting circuit;

enclosing the superconducting circuit covered by the multi-layer thin-film coating within a radome;

maintaining cryogenic conditions within the radome;

keeping the superconducting circuit in contact with a localized cold surface of a cryocooler cold-finger probe;

using the cryocooler cold-finger probe to cool the superconducting circuit to an operating temperature below a critical temperature of the superconductor material;

exposing the superconducting circuit covered by the multi-layer thin-film coating to electromagnetic radiation that emanates from a location outside of, and that passes through, and that potentially scatters within, the radome; and reflecting, with the multi-layer thin-film coating, visible- and ultraviolet-spectrum radiation as well as unwanted RF signals within the electromagnetic radiation, wherein the unwanted RF signals have frequencies outside a desired range of interest corresponding to the superconducting circuit.

* * * * *